United States Patent
Binns

[19]

[11] Patent Number: 6,137,298

[45] Date of Patent: Oct. 24, 2000

[54] METHOD AND APPARATUS FOR CLAMPING LAND GRID ARRAY INTEGRATED CIRCUIT DEVICES

[75] Inventor: Byron Binns, Mountain View, Calif.

[73] Assignee: Compaq Computer Corporation, Cupertino, Calif.

[21] Appl. No.: 08/986,374

[22] Filed: Dec. 5, 1997

[51] Int. Cl.[7] .................................................. G01R 31/02
[52] U.S. Cl. ......................................... 324/755; 439/331
[58] Field of Search .................................. 324/754, 755, 324/760, 72.5, 158.1; 439/73, 331

[56] References Cited

U.S. PATENT DOCUMENTS

| | | | |
|---|---|---|---|
| 3,942,854 | 3/1976 | Klein et al. | 439/331 |
| 3,970,934 | 7/1976 | Aksu | 324/754 |
| 4,456,318 | 6/1984 | Shibata et al. | 439/68 |
| 4,553,805 | 11/1985 | Aikens | 439/325 |
| 5,473,510 | 12/1995 | Dozier, II | 361/719 |
| 5,648,893 | 7/1997 | Loo et al. | 361/820 |

*Primary Examiner*—Josie Ballato
*Assistant Examiner*—Minh Tang
*Attorney, Agent, or Firm*—Fenwick & West LLP

[57] ABSTRACT

The system and method of the present invention facilitate clamping of a land grid array integrated circuit (LGA IC) device through adjustment and calibration of the clamping system in relation to the connector/socket features used for a given type of LGA IC device and connector/socket. In order to accommodate for different connector/socket heights, the clamping system of the present invention includes exchangeable calibrated springs and an exchangeable shim that enable the clamping system to adjust to a specific connector/socket height. Due to the level of calibration, the system and method provides controlled downward vertical force at the level of force required to clamp the pads of the LGA IC device to the contacts of the connector/socket thereby providing complete electric contact therebetween and complete electric contact between the connector/socket and a circuit board. Further, a heat sink and the material content of the supporting structure provide dissipation and stabilization of heat generated by the processor during testing. Still further, the clamping system provides for expeditious replacement of the LGA IC device.

21 Claims, 11 Drawing Sheets

METHOD AND APPARATUS FOR CLAMPING LAND GRID ARRAY INTEGRATED CIRCUIT DEVICES

TECHNICAL FIELD OF THE APPLICATION

This invention relates generally to a method and apparatus for facilitating the clamping of land grid array integrated circuit devices (LGA IC), and more specifically, to a method and apparatus for facilitating the testing of LGA IC devices by providing a universal clamping system that includes a heat sink to dissipate and transfer heat generated during testing, and includes exchangeable components that enable the clamping system to provide the force requirements unique to the specifications of each connector/socket, for firmly clamping each LGA IC device to the contacts of a given connector/socket to promote full electric contact therebetween, and to provide for expeditious replacement of the tested device, thereby minimizing cycle time.

BACKGROUND OF THE INVENTION

Clamping methods and apparatus have become particularly important in a number of key types of manufacturing. For instance, clamping methods and apparatus are needed when testing computer processors, particularly processors that do not include pins, but instead include pads that require vertical force to provide functional contact between the contacts of the connector/socket and the pads of the processor. Such processors are generally referred to as LGA IC devices.

Since the manufacturing life cycle of processor packages continues to shorten as the frequency of processor upgrades and processor packaging upgrades increase, there is a heightened need to constantly develop new clamping systems. Such demands for developing new clamping systems are both costly and time consuming requirements.

Further, delays in developing a clamping system needed to beta test a new processor will typically delay testing or force developers to use an inappropriate clamping system that will likely apply inadequate force and cause improper seating of an LGA IC device into its connector/socket. Such improper seating is likely to cause inadequate electrical contact between the LGA IC device, connector/socket and the test circuit board, thereby skewing the results of processor testing. In a worst case, such improper seating of the LGA could permanently damage the contacts of the connector/socket, as well as the pads of the LGA IC device, an extremely costly mishap.

Typical of conventional clamping methods and apparatus for clamping processors such as LGA's is the use of clamping systems designed as an integral part of a given test connector/socket for a specific processor package. Such conventional LGA clamping connector/socket systems do not adequately address both minimized cycle time and required heat dissipation. Further, such conventional LGA clamps do not provide for evaluation of multiple connector/socket manufacturers' products and, therefore, cannot be used to evaluate connectors/sockets with different specifications.

Typical of conventional clamping methods and apparatus for clamping processors such as LGA's to production connector/sockets is the use of multiple threaded fasteners. Such fasteners can not be used with test connector/sockets since the threaded fasteners cause an unacceptable replacement time (cycle time) for devices and/or test connectors/sockets.

Other conventional clamping systems require the technician to provide the force needed to seat the LGA IC device into a connector/socket mounted upon a test circuit board. Such systems generally require a technician to use his or her thumb to exert such force. However, because current connector/sockets may include approximately 600 or more contacts, the total amount of force a technician may need to apply to an LGA can exceed 100 pounds, a force typically greater than a technician can safely provide. Even if a technician can provide that level of force, generally such force will not be applied in a controlled vertical downward direction. Accordingly, the horizontal forces are likely to distribute unequal pressure upon the contacts, thereby damaging those contacts that receive excessive force or force having other than a pure vertical direction.

Other conventional clamping systems used to seat processors such as an LGA IC device into a connector/socket are uncalibrated "off the shelf" clamps. Such clamps are not specifically designed for use as an LGA clamp. For example, the "Series 225" and "Series 235" clamp by DE-SIA-CO, a Dover Resources Company, of Troy, Mich., are conventional clamps that do not include mechanisms to align and adjust the clamp according to the specifications of each type of LGA and corresponding connector/socket. Use of an "uncalibrated" "off the shelf" clamp to seat an LGA into a connector/socket will generally provide an improper and misdirected level of force that results in inadequate electrical contact between the LGA IC device and connector/socket. Further, such use is potentially damaging to the connector/socket and/or LGA IC device.

Since conventional uncalibrated "off the shelf" clamping systems were not designed specifically for clamping processors within connectors mounted to circuit boards, these systems generally do not include a heat sink, or an area for attaching a heat sink. Accordingly, these conventional clamping systems used for clamping a processor within a connector while the processor undergoes testing are unable to dissipate and transfer the heat produced by the processor. Consequently, because a processor must be maintained at or below 70° C. for proper functioning and since the processing of current LGA IC devices may dissipate as much as 28 watts of heat, the absence of a heat sink could prove fatal to the processor. More particularly, during such tests, processors, such as an LGA IC device, are likely to overheat and fail or perform erratically.

As a result of the above considerations, there is a need for a clamping system used to clamp an LGA integrated circuit device to a connector/socket mounted upon a test circuit board that is universal in use and is therefore adjustable to all types of LGA IC devices and connectors/sockets, is easy to calibrate and use, distributes force evenly across a processor and the corresponding connector/socket, provides clamping force in a vertical downward direction, is highly reliable and prevents processors undergoing tests from overheating and failing—requirements which, to the best of applicant's knowledge, have not been achieved with conventional clamping systems used to test LGA IC devices.

SUMMARY OF THE INVENTION

The present invention is directed, in part, to a clamping method and apparatus used to clamp LGA IC devices during the testing and development phases of such processors. The system and method of the present invention provides a universal clamping system which may be adjusted and calibrated to provide force at a level and direction to position and clamp a processor, such as an LGA IC device, within a connector/socket mounted to a circuit board so that the contacts of the connector/socket are in complete electrical contact to the pads of the LGA IC device. Further, the clamping system of the present invention includes a heat sink that provides for dissipation and transference of the significant heat generated by the processor during testing.

As described herein, the present invention includes a universal clamping system that facilitates the development and testing of a processor by providing a predetermined level of evenly distributed force in a downward vertical direction to clamp a land grid array integrated circuit device within a socket mounted to a circuit board that results in complete electric contact therebetween, the universal clamping system comprising: a support structure; a cam arm assembly mounted on the support structure for providing movement and force toward a socket to seat the land grid array integrated circuit device within the socket; a heat sink connected to the cam arm assembly for dissipating heat produced by the operation of the land grid array integrated circuit device; and at least one actuation arm connected to the cam arm assembly and movable to clamp the land grid array integrated circuit device in a downward vertical direction within the socket, wherein pads of the land grid array integrated circuit device are positioned into complete electrical contact with contacts of the socket.

As further described herein, the present invention includes the method as recited in claim 12 wherein the step of calibrating a range further includes: identifying an approximate mid-point in the range that will serve as an objective level of force to apply in a downward direction to the land grid array integrated circuit device so that the land grid array integrated circuit device becomes properly seated within the socket thereby resulting in complete electric contact therebetween; and performing a compression analysis to choose a compression spring, lift spring and shim.

It will be appreciated from the foregoing that, in certain embodiments, a significant aspect of the present invention is the ability to adjust and calibrate the clamping system in relation to the connector/socket features used for a given type of LGA IC device and connector/socket. In order to accommodate for different connector/socket heights and force requirements, the clamping system of the present invention includes exchangeable calibrated springs and an exchangeable shim that enable the clamping system to adjust to a specific connector/socket height in order to provide an adequate level and direction of clamping force.

The clamping system of the present invention may also include a heat sink that provides for adequate dissipation and transference of heat generated by the processor during testing. In addition, the materials of the supporting structure of the clamping system retain the heat created by the processor thereby stabilizing and resisting rapid changes in the level of heat that would otherwise damage the processor.

The present invention also provides controlled downward vertical force when clamping a processor, such as an LGA IC device, to the contacts of a connector/socket, thereby promoting safe clamping without risk of causing damage to the connector's contacts.

Still further, the present invention can provide expeditious replacement of an LGA IC device to be tested by enabling opening and closing of the clamp and engagement with the required level of force, without the use of any tools.

The invention may be better appreciated from the following Figures, taken together with the accompanying Detailed Description of the Invention.

BRIEF DESCRIPTION OF THE DRAWINGS

The invention will now be described with reference to the accompanying drawings, wherein.

DETAILED DESCRIPTION OF A PREFERRED EMBODIMENT

The following description is of the best presently contemplated mode of carrying out the invention. The description is made for the purpose of illustrating the general principles of the invention and is not to be taken in a limiting sense.

Figure 1:
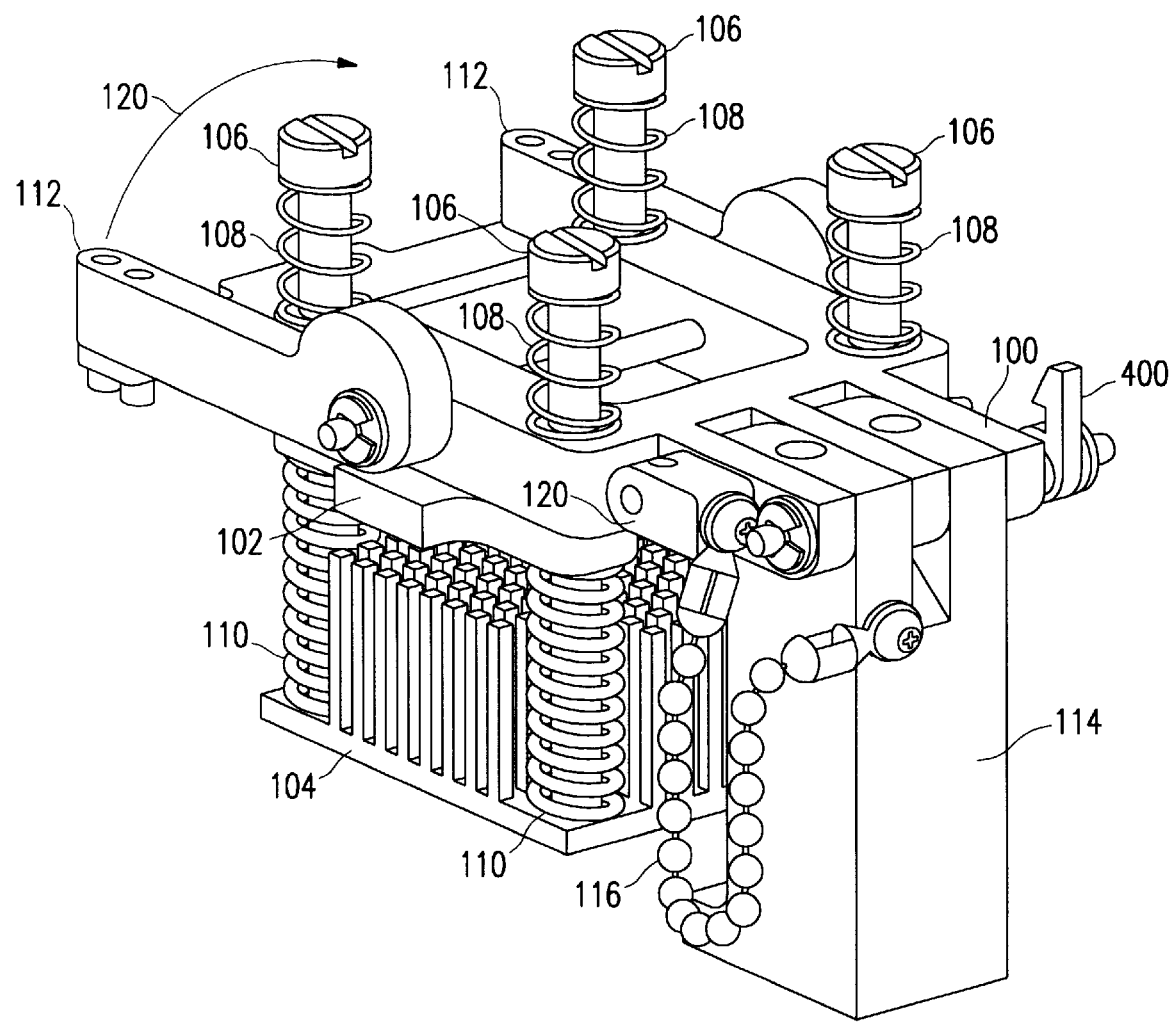
FIG. 1 shows a diagram of a preferred embodiment of the clamping system of the present invention.

Referring first to FIG. 1, an external perspective view of a system for clamping processors such as an LGA IC device may be generally appreciated. As shown, the clamping system includes a compression assembly (see FIG. 2), a cam arm assembly (see FIG. 3), a pedestal assembly (see FIG. 4) and a heat sink 104.

The compression assembly can be adjusted to provide an amount of seating force upon the LGA IC device to provide complete electric contact between the pads on the underside of the processor and the contacts of the connector/socket. An adjustable assembly is provided to account for differences between the types of connector/sockets used for an LGA IC device mounted to a test circuit board. More particularly, each specific combination of an LGA IC device and connector/socket provides a unique final seating height of the LGA IC device and force requirement for the clamping system. Hence, the clamping system of the present invention when fully engaged provides the required level of vertical force at the final seating height of the LGA IC device to ensure complete electric contact between the LGA IC device, connector/socket and circuit board.

In order to provide an adequate level of force regardless of the seating height of the respective LGA IC device, the height and engaged force of the clamping system is adjustable to account for the particular requirements of a given LGA/socket combination. In order to modify the height of the clamping system, specific shim 510 (shown in FIG. 5) is included within the clamping system to position the clamping system in relation to the LGA IC device. Compression springs 110 are replaceable to vary the final "engaged force." The specific relationship between LGA IC device seated height, the appropriate level of force needed to clamp the LGA IC device, and the compression springs 110, lift springs 108 and shim 510 included within the universal clamping system for providing the required force will be discussed hereinbelow with regard to Tables 1 and 2.

The cam arm assembly provides dual cam arms 112 for ease of operation in moving the compression assembly (see FIG. 2) including heat sink 104 in a downward vertical direction upon an LGA IC device positioned over a connector/socket mounted upon a test circuit board. The design of the cam arm assembly (see FIG. 3) as shown provides for the leverage needed to easily move dual cam arms 112 approximately one hundred and eighty degrees (see arrow 120) from an intermediary position as shown to a fully engaged locked position.

The pedestal assembly (see FIG. 4) includes heavily weighted support post 114 that maintains the stability of the clamping system. More particularly, support post 114, preferably composed of cold rolled steel, maintains stability of the clamping system as support arm 100 rotates closed followed by 180° clockwise movement of the cam arm assembly, as shown in FIG. 1 by arrow 120.

The combined effect of heat sink 104 and of the cold rolled steel prevent the processor from overheating and failing or performing erratically. The heat sink dissipates and transfers heat, while the cold rolled steel content of the clamping system has a high thermal mass to provide thermal stability by resisting rapid temperature changes in the environment.

Figure 2:
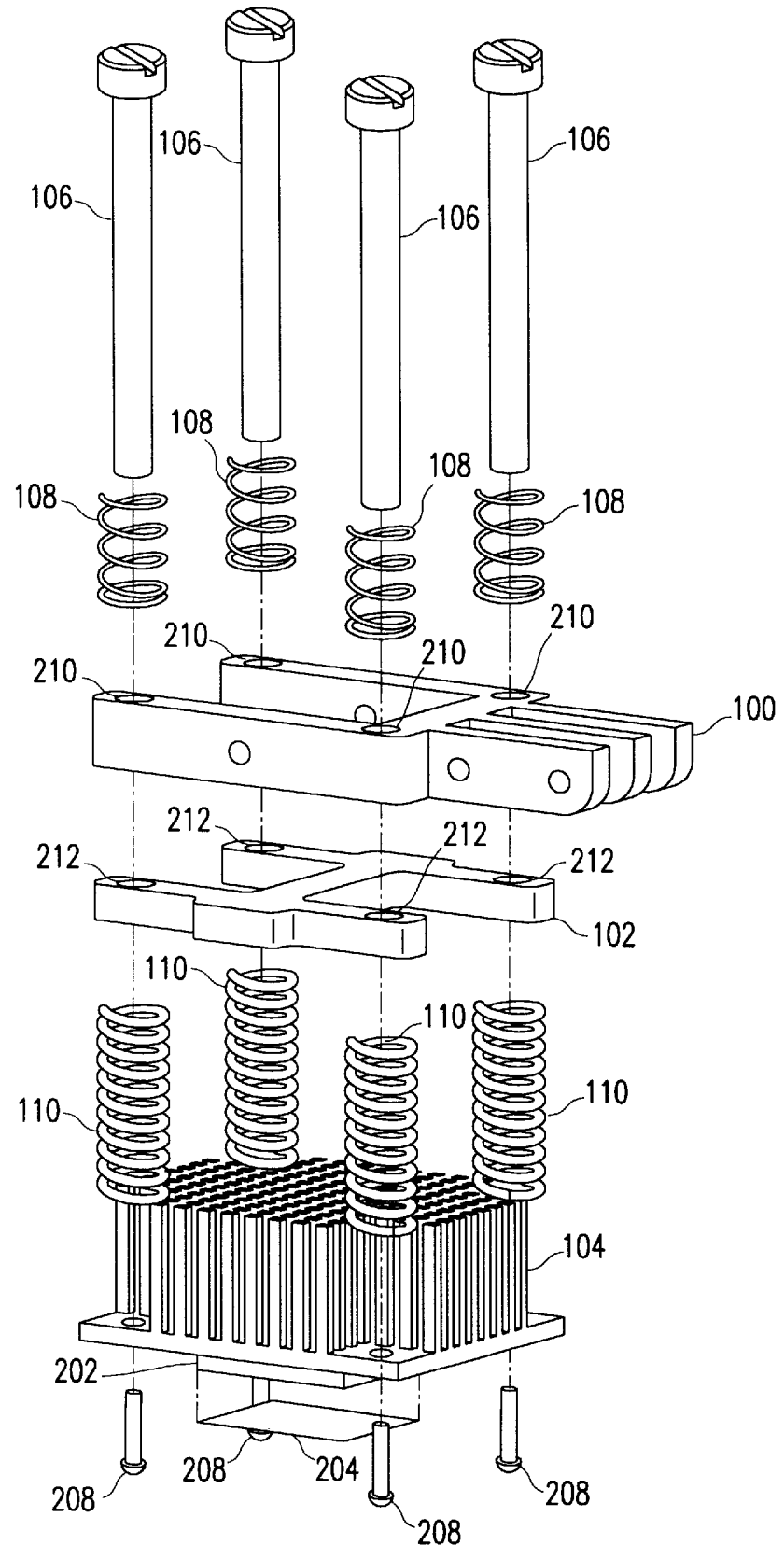
FIG. 2 shows an exploded view of a compression assembly of the clamping system of FIG. 1.

Referring next to FIG. 2, the compression assembly of the clamping system may be understood in greater detail. As shown, the compression assembly (see FIG. 2) includes support arm 100 that includes a U-shaped bracket and three separate arms extending from the bracket. At each of the four corners of the U-shaped bracket is aperture 210. Mechanical compression frame 102 is positioned directly beneath the U-shaped bracket of support arm 100 and includes an aperture 212 corresponding to each aperture 210 of the U-shaped bracket. Each pair of corresponding apertures of the support arm 100 and the mechanical compression frame 102 are so aligned to provide for one continuous aperture.

A lift spring 108 is coiled around the shaft of each shoulder screw 106. Each shoulder screw 106 is inserted into a continuous aperture formed between support arm 100 and compression frame 102 thereby fixing each lift compression spring 108 into a position between the head of shoulder screw 106 and the upwardly facing surface of support arm 100. Bushings (not shown) at each aperture 210 align and reduce friction of movement within. Lift springs 108 provide the clamping system a negative releasing force that pulls the compression assembly and heat sink 104 away from the LGA IC device when the clamping system is disengaged. In an exemplary but not limiting embodiment, the lift springs 108 have a nominal disengaged deflection of 0.20 inches and a nominal engaged deflection of 0.40 inches.

For each shoulder screw 106, compression spring 110 is coiled around a portion of the shaft of shoulder screw 106 between the downwardly facing surface of compression frame 102 and the upwardly facing surface of the base of heat sink 104. Each shoulder screw 106 rests against a bearing surface at one of the four corners of the base of heat sink 104. Screw 208 firmly secures each shoulder screw 106 within the continuous aperture formed between support arm 100 and compression frame 102. In an exemplary but not limiting embodiment, when fully engaged, the compression springs 110 each have a nominal deflection of 0.211 inches at full engagement.

Parallel alignment of shoulder screws 106 is particularly important. Further, shoulder screws 106 should be positioned so as not to impede movement of heat sink 104. Still further, the alignment of compression frame 102 is oriented in relation to the mechanical support post 114 of the pedestal assembly.

The specifications of compression springs 110 and lift springs 108 will depend upon the type and particular specifications of the socket/connector used for testing the LGA IC device. As shown in Table 1, the springs 110 and 108 and shim 510 (not shown in FIG. 1) included within the clamping system depend upon the specifications unique to each connector/socket produced by a given manufacturer. Table 1 shows three connectors wherein each connector is produced by a different manufacturer, the corresponding compression spring 110, lift spring 108, and shim 510 that when included within the clamping system provides a level of force as specified for each connector that appropriately seats the LGA IC device within the socket. The manufacturers include CINCH CONNECTORS, CONNECTOR DIVISION OF LABINA INC., of Elk Grove Village, Ill., LORANGER INTERNATIONAL CORP, of Warren, Pa. and OZ-TECHOLOGIES, INC. (OZTEC), of Hayward, Calif. Table 1 below lists for each manufacturer, the part number of the compression spring and lift spring manufactured by LEE SPRING COMPANY of Brooklyn N.Y. and the height of the shim 510, that when included within the clamping system result in a delivery of force that provides complete electric contact between the LGA IC device and connector/socket.

TABLE 1

| CONNECTOR MANUFACTURER | COMPRESSION SPRING | LIFT SPRING | SHIM |
| --- | --- | --- | --- |
| CINCH | LHL-500B-03-M | LC-036G-5-M | NONE |
| LORANGER | LC-072G-07-M | LC-036G-5-M | .048 in. |
| OZTEC | LC-067G-07-M | LC-036G-5-M | .090 in. |

In order to determine which lift spring 108, compression spring 110 and shim 510 to install in the clamping system for a given connector/socket, it is necessary to identify the force specifications and engaged height of the Connector/socket. More particularly, for each connector/socket, a manufacturer provides specifications that identify the nominal resting height of the contact pads of an LGA IC device when a specified force is applied to the device, and the force needed to seat an LGA IC device within the connector/socket to ensure complete electric contact between the pads of the LGA IC device and contacts of the connector/socket. Once the specifications are known, a "clamping force" analysis is performed to identify the compression spring 110, lift spring 108 and shim 510 to include within the clamping system that provide the specified connector/socket force.

In Table 2 hereinbelow, a "clamping force" analysis example can be generally appreciated. As shown, the manufacturer of this connector example is CINCH CONNECTORS, CONNECTOR DIVISION OF LABINA INC., of Elk Grove Village, Ill. The values as provided below in Table 2 are listed within Table 3.

The steps of performing a clamping force analysis are as follows:

First, determine the range of force a manufacturer requires for clamping an LGA IC device to the contacts of a connector/socket. As shown in Table 3, the minimum and maximum contact forces are respectively two and three ounces per contact. Hence, for an exemplary but not limiting embodiment of a connector/socket that includes 599 contacts, the total force needed to clamp the LGA IC device to a socket ranges from 74.875 to 112.3125 lbs. The range of force is determined by multiplying the force per contact, respectively two and three ounces per contact by the total number of contacts, and then by converting the force in ounces to pounds.

Second, identify an approximate mid-point in the range that will serve as an objective force in choosing a compression spring 110, lift spring 108, and shim 510.

Third, determine the engaged connector height a manufacturer specifies, preferably for the range of force as specified in the "First Step" hereinabove. Hence, for an exemplary but not limiting connector/socket that includes 599 contacts, the seated height is 0.090 inches.

Fourth, perform the analysis as shown below in lines 1–9 of Table 2 to identify a compression spring 110, lift spring 108 and shim 510 that, when included within the clamping system, provide an approximate mid-point level of force. More particularly, as shown below in lines 1–4 of Table 2, the first stage of the analysis includes a determination of the height delta of the connector/socket from a nominal connector engaged height. By taking into account the height delta, a determination can be made to factor the shim height into the second stage "applied force" analysis. In order to begin the analysis the CINCH connector was chosen as the base-line (nominal) connector. Accordingly, a clamping system applying force to a CINCH connector does not include shim 510, thereby accounting for the shim height as listed below of zero. However, for other connectors/sockets, as shown in Tables 3–6, shim heights are determined pursuant to specifications of each connector/socket.

In the second stage of the analysis as shown in lines 5–9 of Table 2, identify the compression and lift springs that provide forces which when analyzed provide an applied force at approximately the mid-point range of the connector's minimum and maximum force specifications. In order to determine whether the combined effect of the compression and lift springs provide such midpoint force, the quantitative difference between the force of the compression spring and lift spring is taken.

In an alternative embodiment of the "Clamping Force Analysis" shown in Table 2, the applied force analysis is performed prior to the height analysis. Regardless of the order, it is important to choose a shim 510, compression spring 110 and lift spring 108 that when included within a clamping system provide a level of force at approximately the mid-point of the connector/socket's specified force range.

TABLE 2

"Clamping Force Analysis"

CINCH EXAMPLE

| c = connector height | a = shim height |
| d = delta from nominal connector height | f = applied force per spring pair |
| $k_l$ = k factor for lift springs | $k_c$ = k factor for compression springs |
| .087 = nominal connector height | FF = total force on device = 4 * f |
| [1]. | HEIGHT DELTA = [Connector Height − Nominal Connector Height] − Shim Height |

TABLE 2-continued

"Clamping Force Analysis"

| [2]. | D = (c − .087) − a |
| [3]. | = (.090 − .087) − 0 |
| [4]. | = .003 in. |
| [5]. | APPLIED FORCE = [Compression Spring Force − Lift Spring Force] |
| [6]. | FF = (4 * ($K_c$(.211 + d) − ($K_l$ * (.400 − d))] |
| [7]. | = (4 * (120(.211 + .003) − (7.240 * (.400 − .003))) |
| [8]. | = 4 * (25.68 − 2.87428) |
| [9]. | = 91.223 (lbs.) |

For each manufacturer listed in Tables 3–6, apply the analysis as described in Table 2 to each different connector/socket. The connector/socket manufacturers of Table 3 include CINCH CONNECTORS, CONNECTOR DIVISION OF LABINA INC., of Elk Grove Village, Ill. and LORANGER INTERNATIONAL CORP, of Warren, Pa. The connector/socket manufacturers of Table 4 include OZ-TECHOLOGIES,. INC., of Hayward, Calif., and AUGAT INTERCONNECTION PRODUCTS DIVISION of Attleboro Falls, Mass. The connector/socket manufacturers of Table 5 include (JAE) JAPAN AVIATION ELECTRONICS LIMITED of Japan. The connector/socket manufacturers of Table 6 include AUGAT INTERCONNECTION PRODUCTS DIVISION of Attleboro Falls, Mass. An explanation of each element listed in Tables 3–6 is described hereinbelow in Table 3.

Now returning to FIG. 2, thermal pedestal 202 is attached to the downwardly facing side of heat sink 104 in order to transfer heat from the LGA IC device. Thermal transfer material pad 204, preferably made of composite material, is mounted to the downwardly facing side of thermal pedestal 202. Thermal pad 204 further facilitates heat transfer from the LGA IC device to the thermal pedestal 202.

Figure 3:
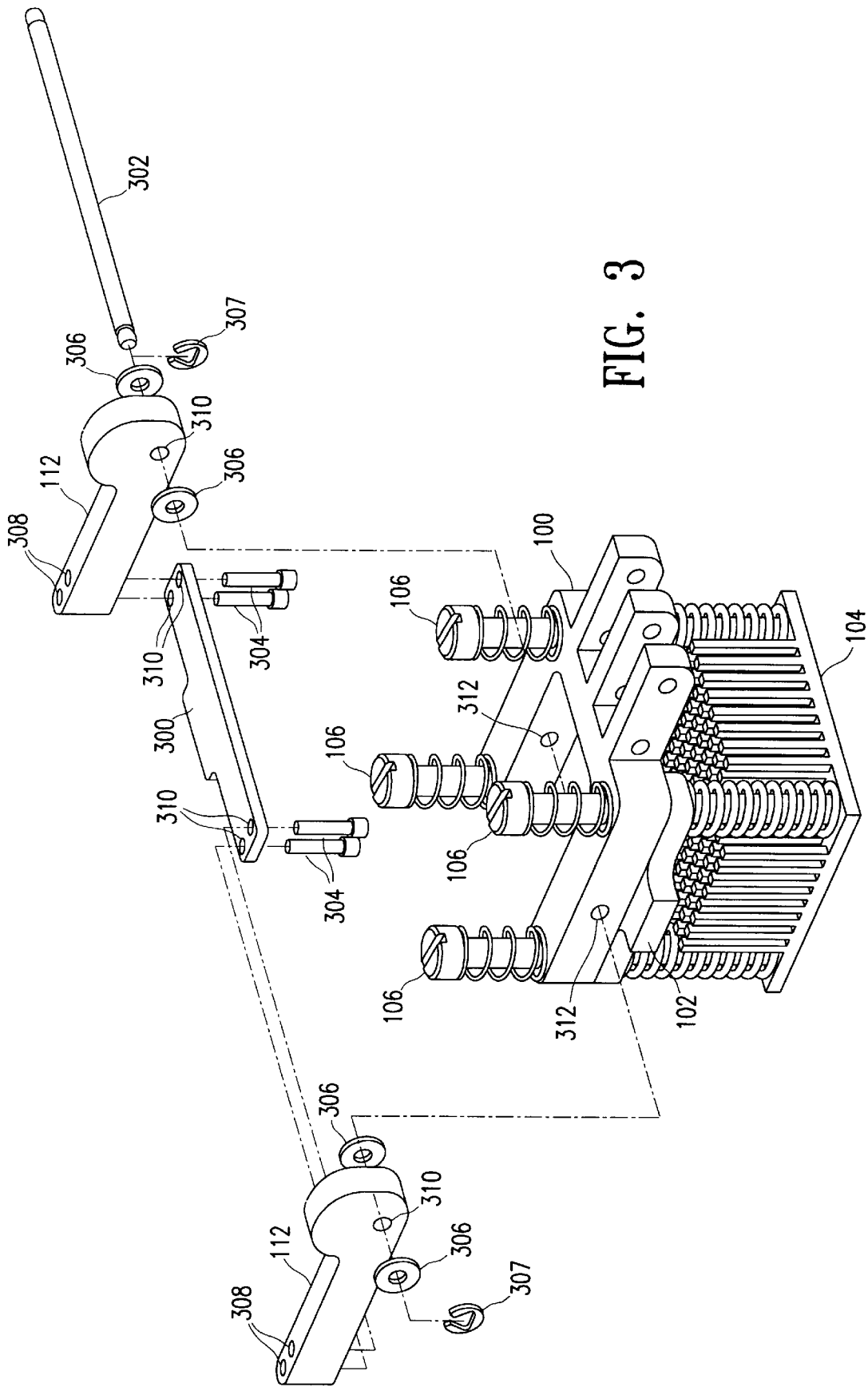
FIG. 3 shows an exploded view of a diagram of a CAM arm assembly of the clamping system of FIG. 1.

Referring next to FIG. 3, the cam arm assembly of the clamping system may be understood in greater detail. As shown, a pair of cam arms 112 spaced in parallel relation to each other are connected at corresponding end portions by mechanical lever 300. Cap screws 304 positioned within corresponding apertures of mechanical lever 300 and cam arms 112 firmly secure the connection therebetween. Each cam arm 112 is secured by cam pin 302 and corresponding washers 306 and fasteners 307 to an outwardly facing side of mechanical support arm 100. More particularly, apertures 308 of cam arm 112 and mechanical lever plate 300 are aligned where screws 304 are inserted within. Apertures 310 of cam arm 112 and apertures 312 of support arm 100 are aligned to create one continuous aperture where cam pin 302 is inserted within. Washers 306 placed on each side of each cam arm 112 provide for ease of movement of approximately one hundred and eighty degrees around cam pin 302. Fasteners 307 secure cam pin 302 to washers 306, cam arms 112, and support arm 100.

Figure 4:
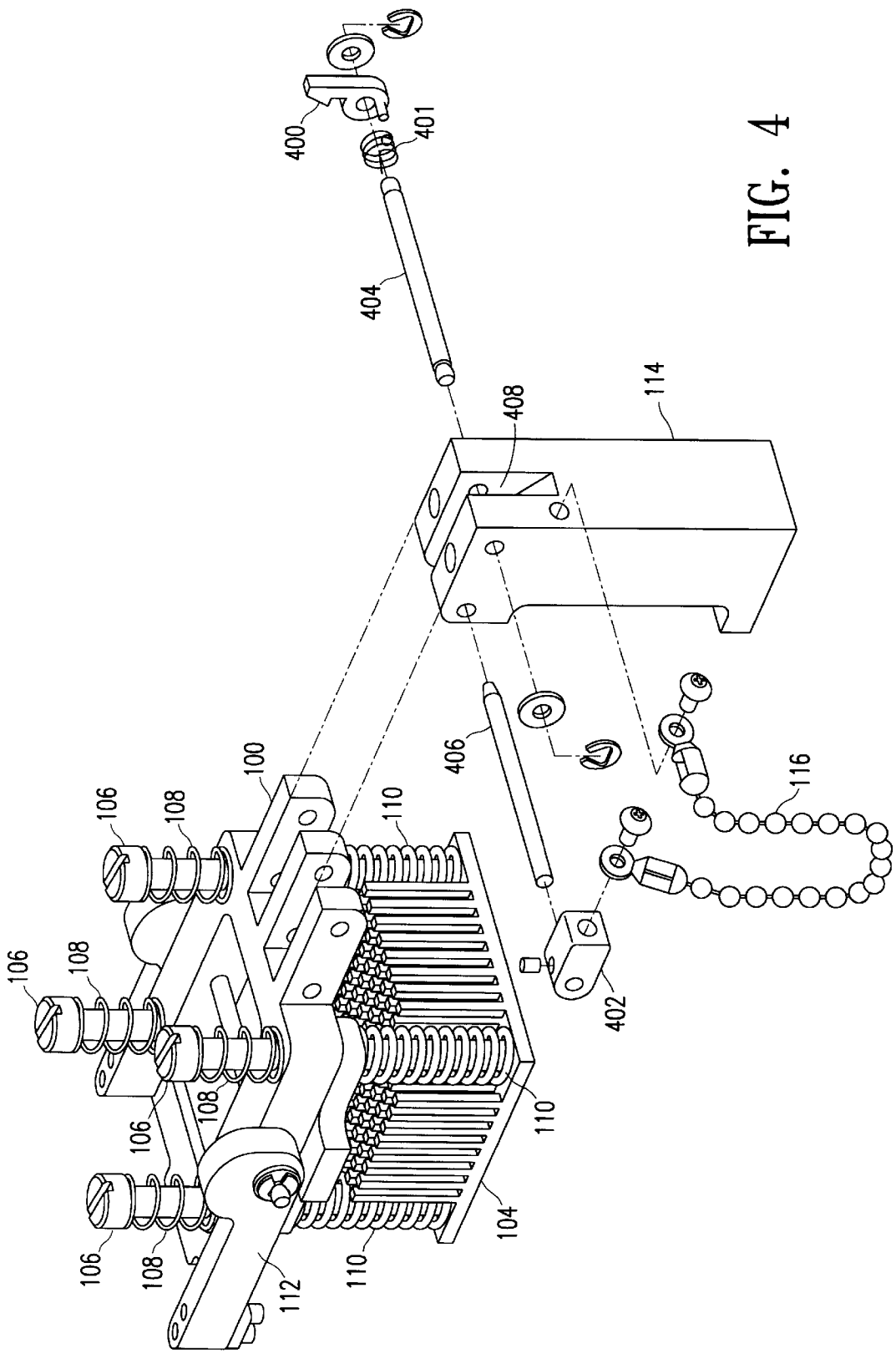
FIG. 4 shows an exploded view of a diagram of a pedestal assembly of the clamping system of FIG. 1.

Referring next to FIG. 4, the pedestal assembly of the clamping system may be understood in greater detail. As shown, the pedestal assembly includes mechanical support post 114 including a slot 408 for receiving the middle of three arms extending from support arm 100. In an exemplary but not limiting embodiment of the present invention, support post 114 and support arm 100 are composed of cold rolled steel and are manufactured in pairs to maintain critical dimension requirements between each element. Critical dimension requirements are needed to ensure appropriate alignment and height of support arm 100 relative to the support post 114 when the clamping system is in a closed position.

Hinge pin 404 inserted in a rear continuous aperture formed between the mechanical support post 114 and three arms extending from support arm 100 provide the clamping system hinged movement in an opening and closing action. In order to replace the current LGA IC device from the recess of the connector/socket 504 with a new device, the clamping system must be opened for access to the device. Once a new LGA IC device is placed in the recess of the connector/socket 504, the clamping system is closed into a position directly above the new device.

In order to ensure that the clamping system remains in a fixed position, locking pin assembly 402 and 406 is inserted in a front continuous aperture formed between the post 114 and support arm 100. Chain 116 attached to locking pin assembly 402 and 406 ensure availability of the pin when it is needed to engage the clamping device. When the clamping system is correctly aligned over the LGA IC device and the technician is prepared to begin testing the clamping system must be engaged. To fully engage the clamping system, the pair of cam arms are moved one hundred and eighty degrees in a clockwise direction from the position shown in FIG. 4 into a completely opposite position. Movement of the cam arms 112 moves the compression frame in a controlled vertical downward direction, by force of cam arms 112 against compression frame 102, thereby applying force to the LGA IC device and compressing the contacts of the connector/socket.

Once the clamping system is fully engaged, locking hook 400 attached to one end portion of the hinge pin 404 with torsion spring 401 therebetween, automatically locks onto mechanical lever plate 300. While undergoing testing, locking the locking hook 400 prevents accidental disengagement of cam arms 112.

Figure 5:
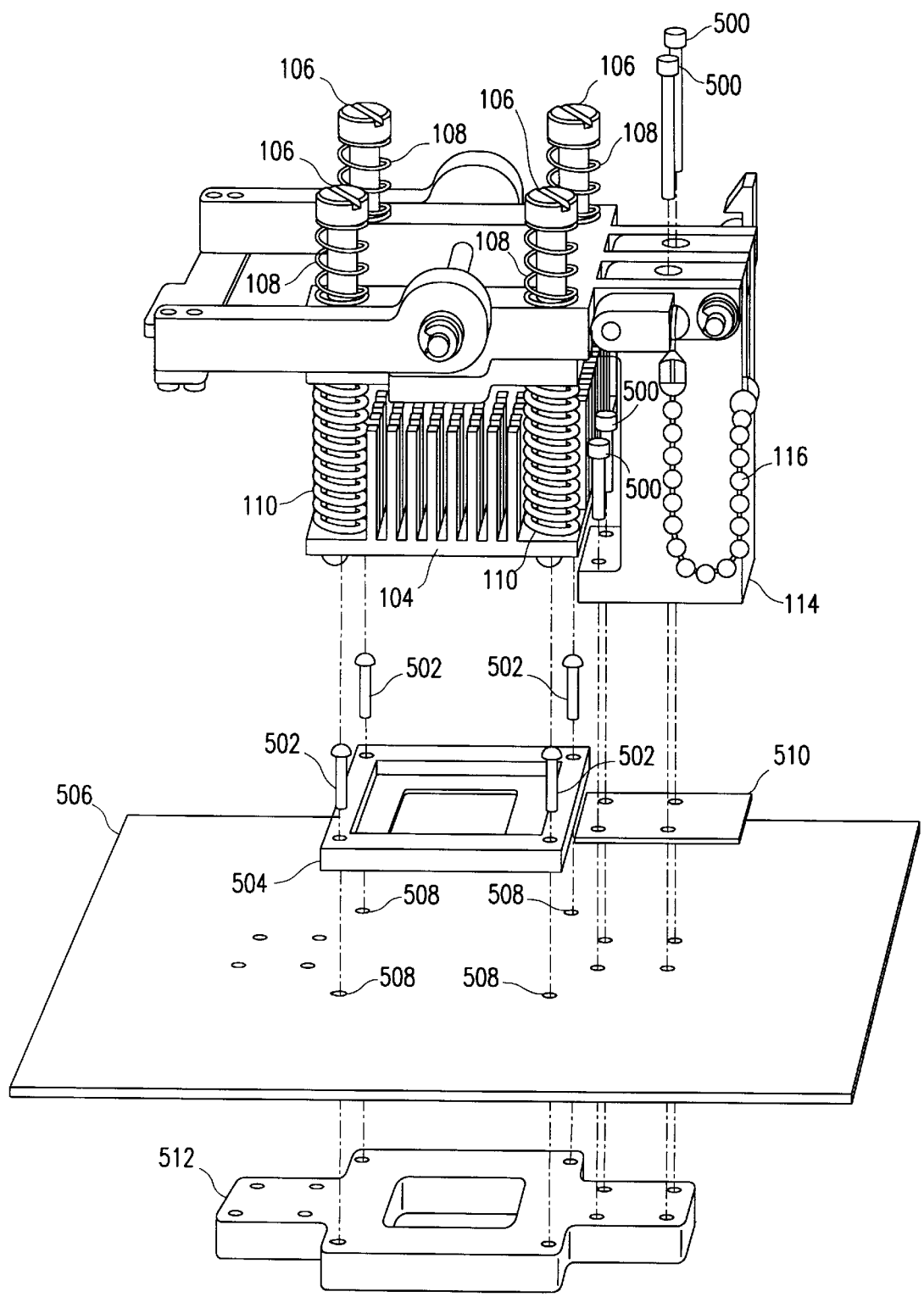
FIG. 5 shows an exploded view of a diagram of a mounting of the clamping system of FIG. 1.

Referring next to FIG. 5, mounting of the clamping system of FIG. 1 over a connector/socket 504 may be understood in greater detail. As shown, a connector/socket 504 is mounted with screws 502 to a "device under test" (DUT) board 506 also commonly known as a printed circuit board. The connector/socket 504 is attached through apertures 508 of the DUT board 506 to mechanical backplate 512. Mechanical support post 114 is mounted to DUT board 506 with shim 510 therebetween and mechanical backplate 512 positioned at the underside of DUT board 506.

The specifications of shim 510 depend upon the height of connector/socket 504 (See Table 1). Hence, for a given connector/socket 504, a specific combination of shim 510, compression spring 110 and lift spring 108 are included within the clamping system. Shim 510, compression spring 110 and lift spring 108 are chosen so that movement of the clamping system toward a processor, such as an LGA IC device positioned within connector/socket 504, occurs in a vertical downward direction with a level of force to provide complete electrical contact between the electrical connections of the DUT board 506, the contacts of the connector/socket 504, and the pads on the underside of the LGA IC device (not shown). In order to provide the necessary level of force, the clamping system takes into account the height of connector/socket 504.

In addition to the thermal effects discussed above, heat sink 104 serves to transfer the force provided by the springs of the clamping system to the LGA IC device.

Referring next to FIGS. 6 to 11, the use of the clamping system may be understood in greater detail.

Figure 6:
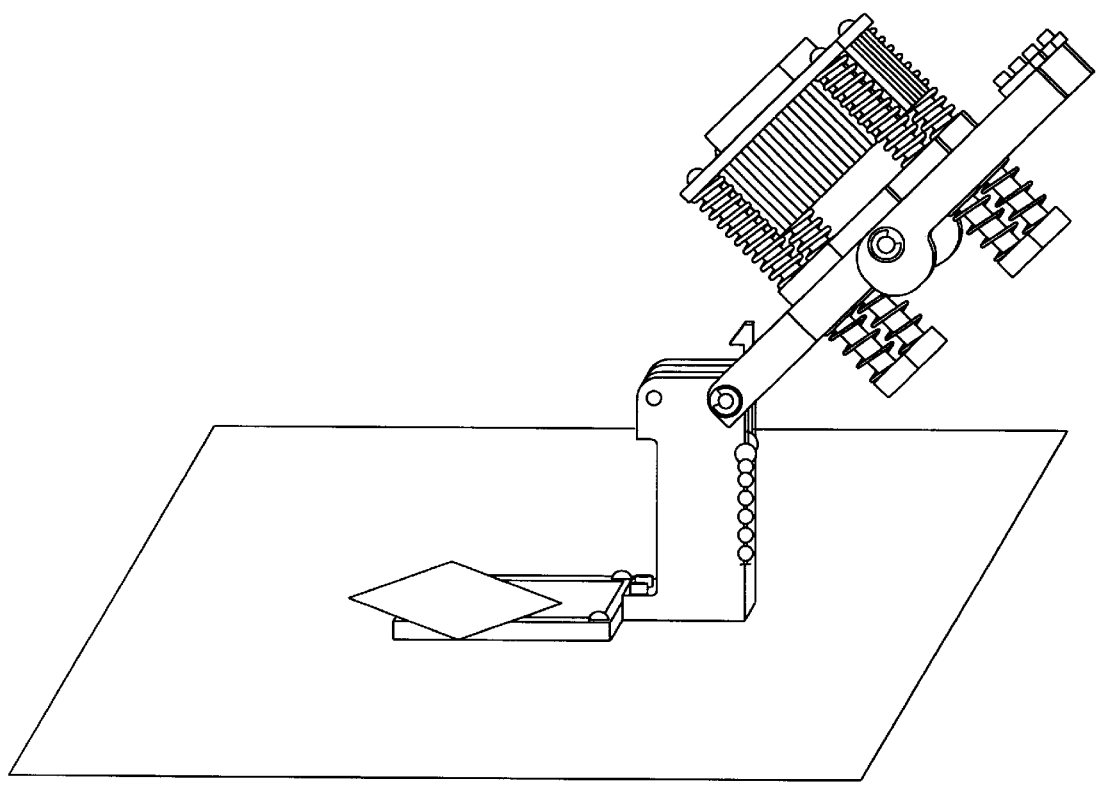
FIG. 6 shows a perspective view of the clamping system of FIG. 1 in a fully disengaged and open state.

More particularly, FIG. 6 shows a perspective view of the clamping system of FIG. 1 in a fully disengaged and open state. The clamping system is placed in a fully open state to remove, place, or replace the LGA IC device.

Figure 7:
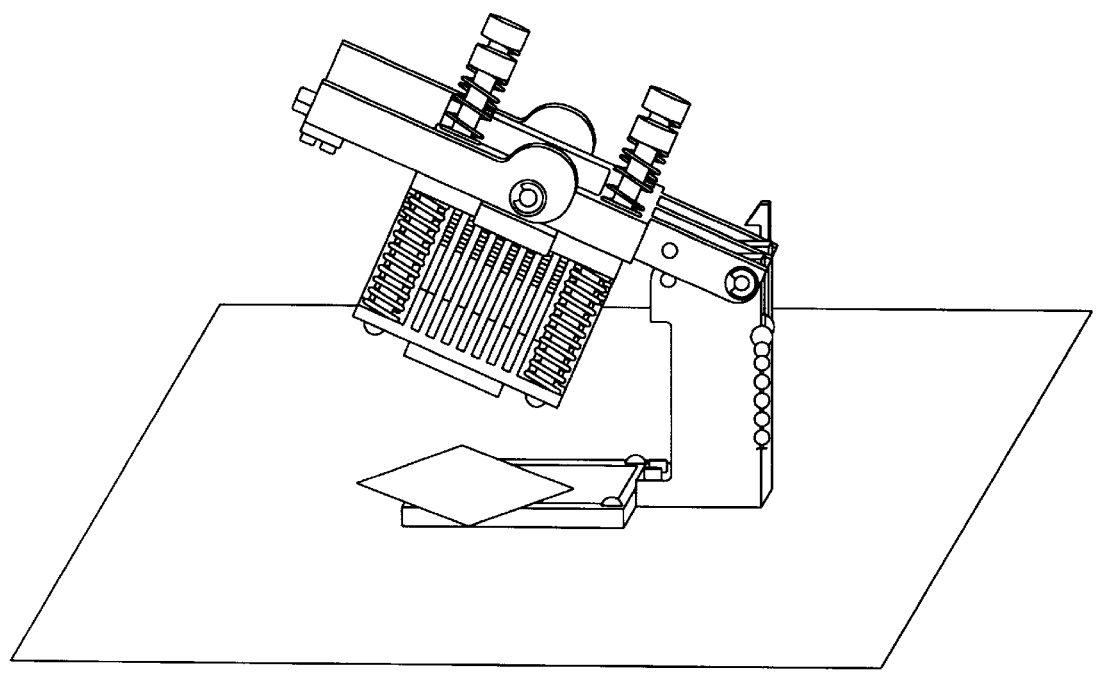
FIG. 7 shows a perspective view of the clamping system of FIG. 1 in a partially closed state.

FIG. 7 shows a perspective view of the clamping system of FIG. 1 positioned at a 45 degree angle as the clamping system is rotated closed to test a new LGA IC device.

Figure 8:
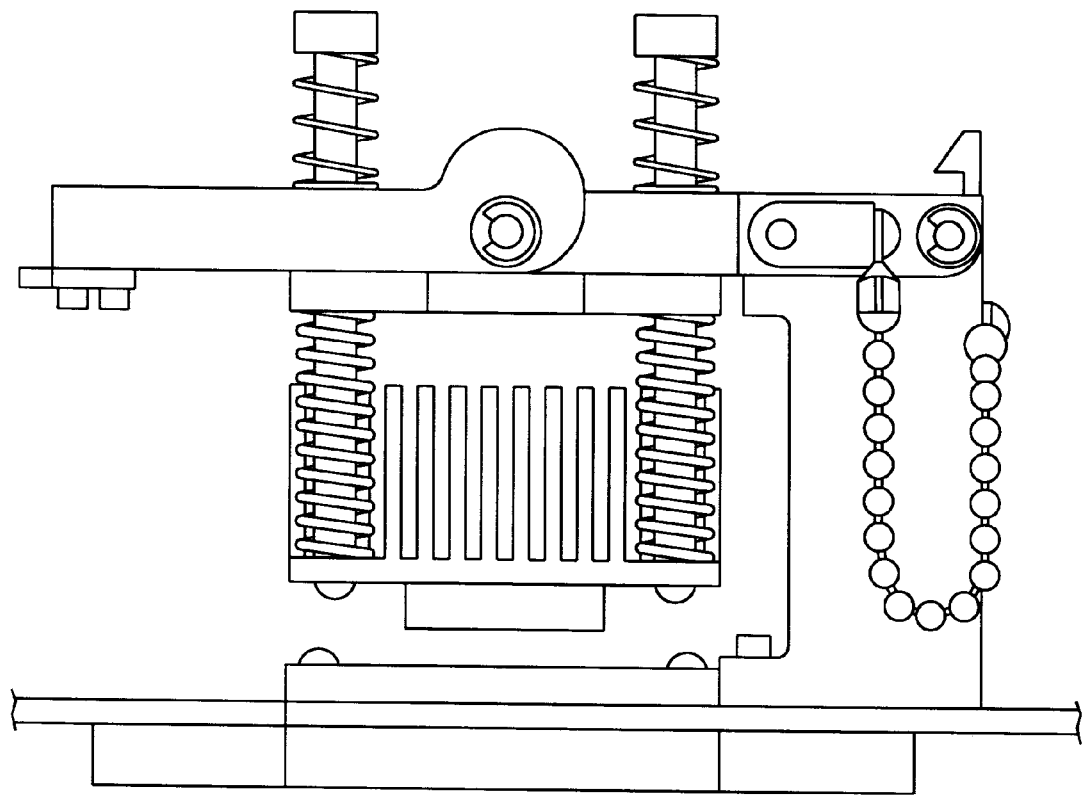
FIG. 8 shows a perspective view of the clamping system of FIG. 1 in a fully closed, disengaged state.

FIG. 8 shows a perspective view of the clamping system of FIG. 1 moved into a fully closed position directly above the LGA IC device. At present, the cam arms 112 are in a disengaged state so that the downwardly facing side of the heat sink is suspended above the LGA IC device.

Figure 9:
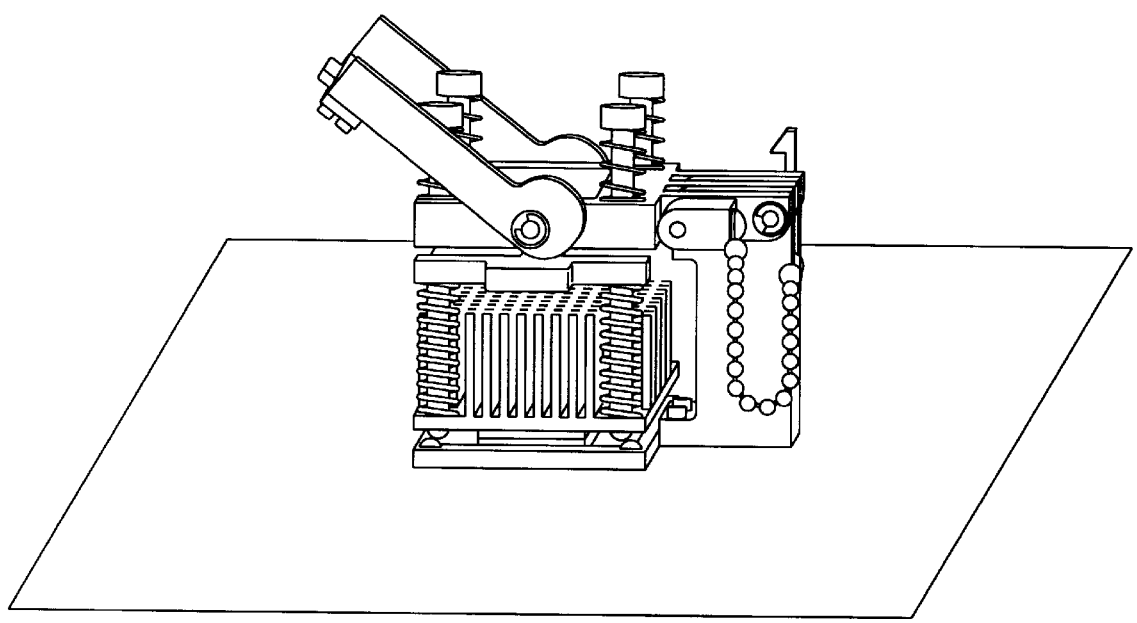
FIG. 9 shows a perspective view of the clamping system of FIG. 1 with the cam positioned at the start of the engagement cycle.

FIG. 9 shows a perspective view of the clamping system of FIG. 1 as the cam assembly is moved into a partially engaged state of approximately 45 degrees. In comparison to FIG. 8, the space is decreased between the downwardly facing side of the heat sink and the LGA IC device.

Figure 10:
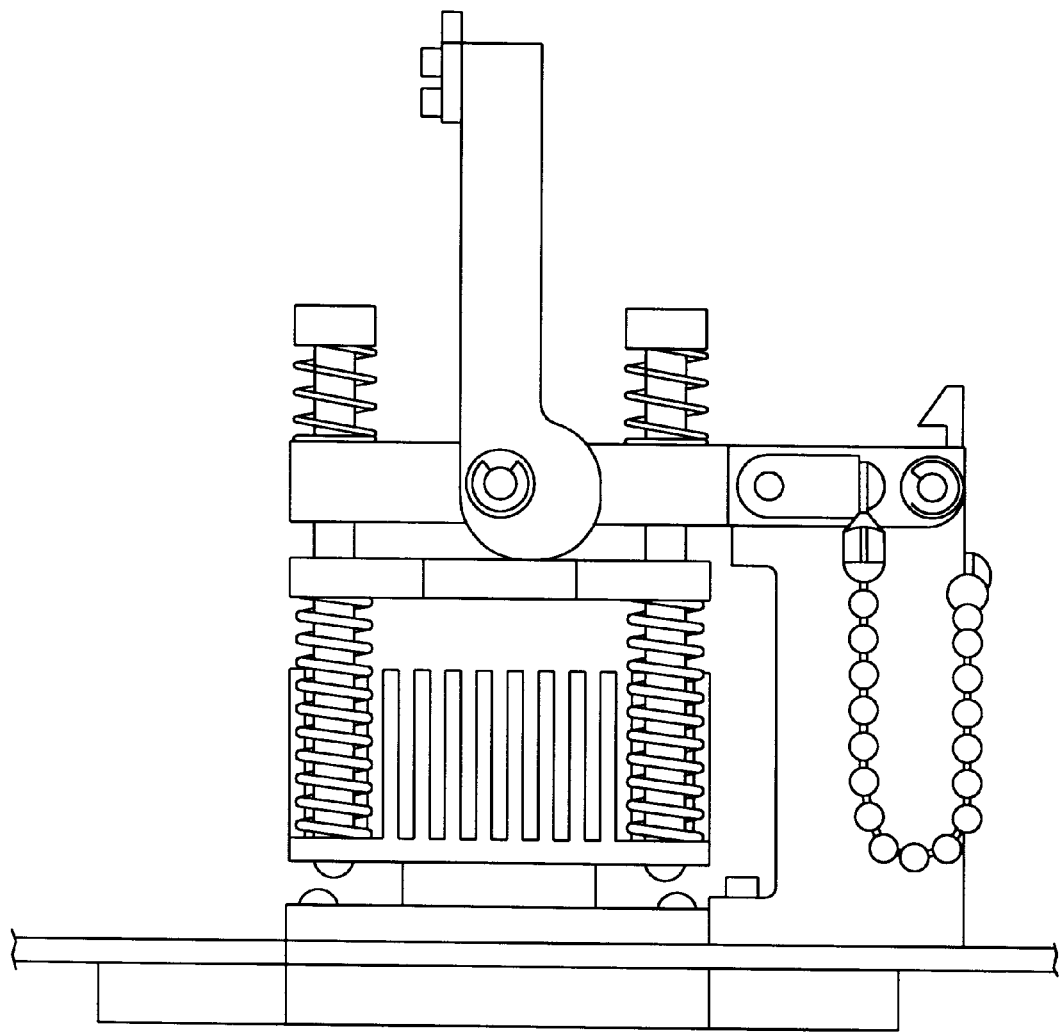
FIG. 10 shows a perspective view of the clamping system of FIG. 1 with the cam engaged in a position at approximately the first point of applying force to the LGA IC device.

FIG. 10 shows a perspective view of the clamping system of FIG. 1 as the cam assembly is moved into a partially engaged state of approximately 90 degrees. In comparison to FIG. 9, the space has been eliminated between the downwardly facing side of the heat sink and the LGA IC device. All further engagement of the cam assembly will apply force to the device.

Figure 11:
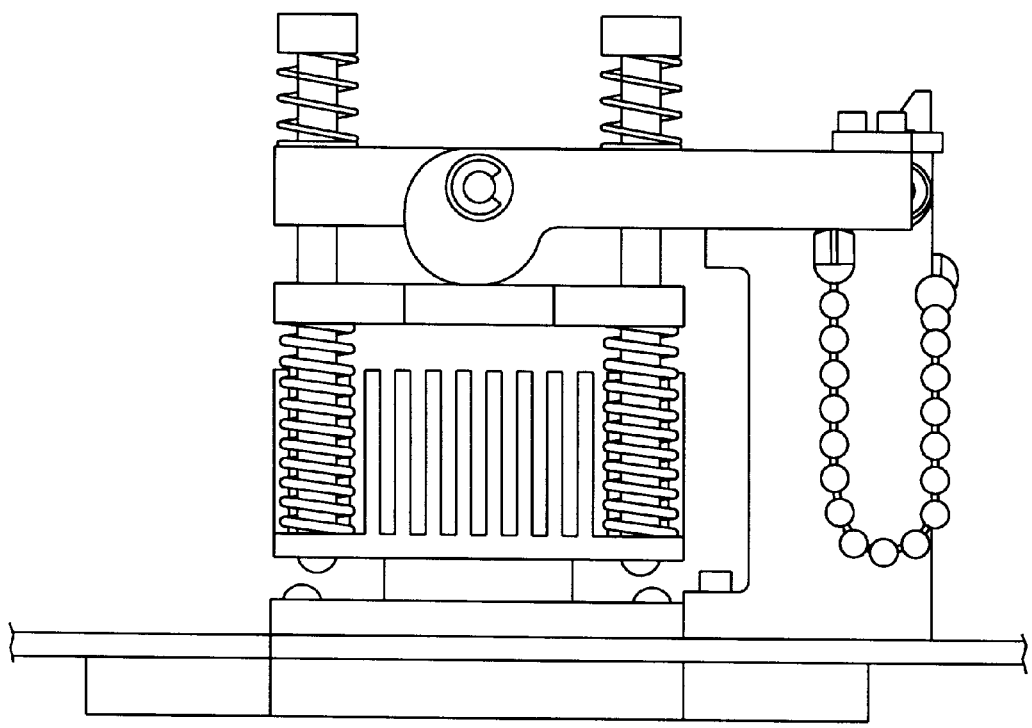
FIG. 11 shows a perspective view of the clamping system of FIG. 1 with the cam fully engaged to place pressure in clamping the LGA IC device.

FIG. 11 shows a perspective view of the clamping system of FIG. 1 with the cam fully engaged to provide a level of force in a vertical downward direction that provides complete electric contact between the pads of the LGA IC device, the contacts of the connector/socket, and the conductive pads on the DUT board.

It can therefore be appreciated that a new and novel clamping system has been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims.

| Elements of Tables 3–6 Defined: | |
|---|---|
| Connector Manufacturer | Definitions |
| Engaged Height (in): | Connector/Socket Height |
| Min contact force (oz) | Connector/Socket minimum force per contact |
| Max contact force (oz) | Connector/Socket maximum force per contact |
| Shim P/N, DUT-C | Recommended shim model number |
| Shim Height (in) | Height of recommended shim model number |
| LEE Spring P/N | LEE SPRING COMPANY part number |
| Compression spring K factor (lb/in) Calculations: | Spring rate of compression spring |
| Height Variable (from nom design) | Difference between the combined height of the connector and the selected shim vs. the nominal connector height of .087 inches |
| Min total contact force (lbs) | Total Connector/Socket minimum contact force |
| Max total contact force (lbs) | Total Connector/Socket maximum contact force |
| Total Clamp Force (lbs) | Total Actual Clamp Force Calculated From Available Compression spring, Lift spring and Shim |
| Force per contact (oz) | Total Actual Clamp Force Calculated as force per contact |

-continued

| Elements of Tables 3–6 Defined: | |
|---|---|
| Connector Manufacturer | Definitions |
| Constants: | |
| Default (nominal) conn height. (in) | Nominal connector height - base line connector height |
| Lift spring K factor (lb/in) | Spring rate of Lift spring |
| Lift spring LEE p/n | Lift spring Model Number |
| Other Contacts Available (Available): | Other possible contact combinations |
| lift springs: K Force (lb/in) | Spring rate |
| P/N (Lee) | Model number |
| compression P/N (Lee) | Model Number |
| springs: | |
| K Force (lb/in) | Spring rate |

TABLE 3

| Connector Manufacturer | Cinch | Loranger |
|---|---|---|
| Variables: | | |
| Engaged Height (in) | 0.090 | 0.136 |
| Min contact force (oz) | 2.000 | 1.059 |
| Max contact force (oz) | 3.000 | |
| Shim P/N, DUT-C | none | 134510 |
| Shim Height (in) | 0.000 | 0.048 |
| LEE Spring P/N | LHL-500B-03-M | LC-072G-07-M |
| Compression spring K factor (lb/in) | 120.000 | 65.660 |
| Calculations: | | |
| Height Variable (from nom design) | +0.003 | +0.001 |
| Min total contact force (lbs) | 74.875 | 39.646 |
| Max total contact force (lbs) | 112.313 | 0.000 |
| Total Clamp Force (lbs) | 91.223 | 44.125 |
| Force per contact (oz) | 2.437 | 1.179 |
| Force per contact (g) | 69.078 | 33.413 |
| Constants: | | |
| Default (nominal) conn height. (in) | 0.087 | 0.087 |
| Lift spring K factor (lb/in) | 7.240 | 7.240 |
| Lift spring LEE p/n | LC-036G-5-M | LC-036G-5-M |
| Other Contacts Available (ON HAND): | | |
| lift springs: K Force (lb/in) | 4.000 | 9.000 |
| P/N (Lee) | LC-026E-10-M | LC-038G-5-M |
| force contacts: P/N (Lee) | LHL-500AB-03-M | |
| K Force (lb/in) | 98.000 | |

TABLE 4

| Connector Manufacturer | Oz-Tec | Augat |
|---|---|---|
| Variables: | | |
| Connector P/N | 0.180 | 0.031 |
| Engaged Height (in) | | |
| Min contact force (oz) | 0.635 | 1.059 |
| Max contact force (oz) | 1.130 | 1.765 |
| Shim P/N, DUT-C | 134514 | none |
| Shim Height (in) | 0.090 | 0.000 |
| LEE Spring P/N | LC-067G-07-M | LHL-500AB-03-M |
| Compression spring K factor (lb/in) | 47.800 | 98.000 |
| Calculations: | | |
| Height Variable (from nom design) | +0.003 | −0.056 |
| Min total contact force (lbs) | 23.788 | 39.646 |
| Max total contact force (lbs) | 42.289 | 66.077 |
| Total Clamp Force (lbs) | 29.420 | 47.554 |

TABLE 4-continued

| Connector Manufacturer | Oz-Tec | Augat |
|---|---|---|
| Force per contact (oz) | 0.786 | 1.270 |
| Force per contact (g) | 22.278 | 36.010 |
| Constants: | | |
| Default (nominal) conn height. (in) | 0.087 | 0.087 |
| Lift spring K factor (lb/in) | 7.240 | 7.240 |
| Lift spring LEE p/n | LC-036G-5-M | LC-036G-5-M |

TABLE 5

| Connector Manufacturer | JAE | JAE |
|---|---|---|
| Variables: | | |
| Engaged Height (in) | 0.081 | 0.081 |
| Min contact force (oz) | 2.650 | 2.650 |
| Max contact force (oz) | 3.240 | 3.240 |
| Shim P/N, DUT-A | none | none |
| Shim P/N, DUT-C | none | none |
| Shim Height (in) | 0.000 | 0.000 |
| LEE Spring P/N | LHL-500C-03-M | LHL-500C-03-M |
| Compression spring K factor (lb/in) | 164.000 | 164.000 |
| Calculations: | | |
| Height Variable (from nom design) | −0.006 | −0.006 |
| Min total contact force (lbs) | 99.209 | 99.209 |
| Max total contact force (lbs) | 121.298 | 121.298 |
| Total Clamp Force (lbs) | 122.722 | 113.368 |
| Force per contact (oz) | 3.278 | 3.028 |
| Force per contact (g) | 92.931 | 85.848 |
| Constants: | | |
| Default (nominal) conn height. (in) | 0.087 | 0.087 |
| Lift spring K factor (lb/in) | 7.240 | 13.000 |
| Lift spring LEE p/n | LC-036G-5-M | LC-042G-5-M |

TABLE 6

| Connector Manufacturer | Augat | Augat |
|---|---|---|
| Variables: | | |
| Engaged Height (in) | 0.031 | 0.031 |
| Min contact force (oz) | 1.059 | 1.059 |
| Max contact force (oz) | 1.765 | 1.765 |
| Shim P/N, DUT-C | none | none |
| Shim Height (in) | 0.000 | 0.000 |
| LEE Spring P/N | LHL-500B-03-M | LHL-500C-03-M |
| Compression spring K factor (lb/in) | 120.000 | 164.000 |
| Calculations: | | |
| Height Variable (from nom design) | −0.056 | −0.056 |
| Min total contact force (lbs) | 39.646 | 39.646 |
| Max total contact force (lbs) | 66.077 | 66.077 |
| Total Clamp Force (lbs) | 61.194 | 88.474 |
| Force per contact (oz) | 1.635 | 2.363 |
| Force per contact (g) | 46.339 | 66.997 |
| Constants: | | |
| Default (nominal) conn height. (in) | 0.087 | 0.087 |
| Lift spring K factor (lb/in) | 7.240 | 7.240 |
| Lift spring LEE p/n | LC-036G-5-M | LC-036G-5-M |

We claim:

1. A universal clamping system that facilitates the development and testing of a processor by providing a predetermined level of evenly distributed force in a downward vertical direction to clamp a land grid array integrated circuit device within a socket mounted to a circuit board that results in complete electric contact therebetween, the universal clamping system comprising:

a support structure;

a cam arm assembly mounted on the support structure for providing movement and force toward a socket to seat the land grid array integrated circuit device within the socket;

a heat sink connected to the cam arm assembly for dissipating heat produced by the operation of the land grid array integrated circuit device; and at least one actuation arm connected to the cam arm assembly and movable to clamp the land grid array integrated circuit device in a downward vertical direction within the socket, wherein pads of the land grid array integrated circuit device are positioned into complete electrical contact with contacts of the socket.

2. The universal clamping system as recited in claim 1 further comprising:

a compression assembly interacting with the cam arm assembly for calibrating the force the cam arm assembly applies to the land grid array integrated circuit device.

3. The universal clamping system as recited in claim 2, wherein the compression assembly further comprises:

a plurality of screws;

a plurality of lift springs wherein at least one lift spring is coiled around a portion of a respective one of the plurality of screws, wherein each lift spring provides a negative force to release the compression assembly from the land grid array integrated circuit device seated within the socket; and a plurality of compression springs wherein at least one compression spring is coiled around another portion of a respective one of the plurality of screws, wherein the compression spring provides a positive force to clamp the compression assembly upon the land grid array integrated circuit device seated within the socket, wherein the compression spring and lift spring provide a combined calibrated force to clamp the land grid array integrated circuit device to the socket thereby causing complete electrical contact therebetween.

4. The universal clamping system as recited in claim 3, wherein the compression assembly further includes:

a support arm including a bracket having extending arms, wherein the bracket includes a plurality of apertures; and a mechanical frame juxtaposed to the underside of the support arm and including an aperture aligned in relation to each aperture of the bracket of the support arm to form four sets of contiguous apertures, wherein one of the plurality of screws is inserted into each of the contiguous apertures, and for each screw the lift spring is positioned between the upwardly facing side of the support arm and the top of the screw and the compression spring is positioned between the mechanical frame and the base of the heat sink.

5. The universal clamping system as recited in claim 2, wherein the cam arm assembly comprises:

a pair of cam arms spaced in parallel relation to each other;

a mechanical lever connecting one and the other cam arm at a corresponding end portion; and a cam pin connecting one cam arm to the support structure and the other cam arm to the support structure, wherein the cam pin enables unified cam arm movement of approximately one hundred and eighty degrees around the cam pin.

6. The universal clamping system as recited in claim 2, wherein the support structure further comprises:

a support arm having three contiguous arms, each arm including an aperture aligned in relation to the apertures of the other arms;

a mechanical support post having a slot for receiving the middle one of the three extended arms and having aligned apertures along the sides of the slot;

a hinge pin inserted into a rear continuous aperture formed between the apertures of the arms of the support arm and the aligned pair of apertures of the mechanical support post, thereby enabling hinged movement about the mechanical support post of the cam arm assembly, the heat sink, the pair of actuation arms, and the contact assembly; and a locking pin inserted into a front continuous aperture formed between apertures of the arms of the support arm and an aligned pair of apertures of the mechanical support post, wherein the locking pin secures the support arm in a closed horizontal position during application of force.

7. The universal clamping system as recited in claim 6, wherein the support structure further comprises:

a locking hook attached to pivot around the hinge pin, wherein the hook locks the cam arm assembly in the fully activated position to prevent accidental disengagement of the cam arm.

8. The universal clamping system as recited in claim 7, wherein the support structure is composed of a heat transfer material that provides additional dissipation of heat produced by the operation of the land grid array integrated circuit device.

9. The universal clamping system as recited in claim 3, wherein the at least one lift spring has a nominal deflection of 0.40 inches.

10. The universal clamping system as recited in claim 3, wherein the at least one compression spring has a nominal deflection of 0.211 inches.

11. The universal clamping system as recited in claim 8, wherein the heat stabilizing material of the support structure is cold rolled steel.

12. A method of clamping processors to facilitate the development and testing of land grid array integrated circuit devices, the universal clamping method comprising the steps of:

determining a range of force specified for a socket, wherein applying the force seats the land grid array integrated circuit device within the socket to provide complete electric contact therebetween;

providing a clamping system;

calibrating the clamping system to provide a level of force within the specified range of force of the socket;

positioning and moving the clamping system toward the socket so that downward movement of the clamping system provides a level of force in a vertical direction within the specified range of force of the socket; and moving the clamping system to engage the land grid array integrated circuit device with a level of force in a downward vertical direction within the specified range of force to provide complete electrical contact between the land grid array integrated circuit device and the socket.

13. The method as recited in claim 12 wherein the step of calibrating a range further includes:

identifying an approximate mid-point in the range that will serve as an objective level of force to apply in a downward direction to the land grid array integrated circuit device so that the land grid array integrated circuit device becomes properly seated within the socket thereby resulting in complete electric contact therebetween; and performing a compression analysis to choose a compression spring, lift spring and shim.

14. The method as recited in claim 13, wherein the step of performing a shim analysis further comprises:

choosing the compression spring and the lift spring, wherein a difference between a positive force provided by the compression spring set and a negative force provided by the lift spring set are approximately equal to the mid-point in the range, wherein if the force difference is substantially different than the approximate mid-point in the range then choose a different compression spring and lift spring, and wherein if the force difference is slightly different then include a shim to modify the applied force.

15. The method as recited in claim 13, wherein the step of providing a clamping system further comprises:

providing a clamping system that facilitates the development and testing of a processor by providing a level of evenly distributed force in a downward vertical direction to clamp a land grid array integrated circuit device within a socket mounted to a circuit board that results in complete electric contact that includes a support structure, a cam arm assembly mounted on the support structure for providing movement and force toward a socket to seat the land grid array integrated circuit device within the socket, a heat sink connected to the cam arm assembly for dissipating heat produced by the operation of the land grid array integrated circuit device, a pair of actuation arms connected to the cam arm assembly and movable in unison to clamp the land grid array integrated circuit device in a downward vertical direction within the socket wherein pads of the land grid array integrated circuit device are positioned into complete electrical contact with contacts of the socket and a compression assembly interacting with the cam arm assembly for calibrating the force the clamping system applies to the land grid array integrated circuit device.

16. A universal clamping system that facilitates the development and testing of a processor by providing a predetermined level of evenly distributed force in a downward vertical direction to clamp a land grid array integrated circuit device within a socket mounted to a circuit board that results in complete electric contact therebetween, the universal clamping system comprising:

a support structure;

a cam arm assembly mounted on the support structure for providing movement and force toward a socket to seat the land grid array integrated circuit device within the socket;

a heat sink connected to the cam arm assembly for dissipating heat produced by the operation of the land grid array integrated circuit device;

at least one actuation arm connected to the cam arm assembly and movable to clamp the land grid array integrated circuit device in a downward vertical direction within the socket, wherein pads of the land grid array integrated circuit device are positioned into complete electrical contact with contacts of the socket; and a compression assembly interacting with the cam arm assembly for calibrating the force the cam arm assembly applies to the land grid array integrated circuit device;

wherein the compression assembly further comprises:

a plurality of screws;

a plurality of lift springs wherein at least one lift spring is coiled around a portion of a respective one of the plurality of screws, wherein each lift spring provides a negative force to release the compression assembly from the land grid array integrated circuit device seated within the socket; and a plurality of compression springs wherein at least one compression spring is coiled around another portion of a respective one of the plurality of screws, wherein the compression spring provides a positive force to clamp the compression assembly upon the land grid array integrated circuit device seated within the socket, wherein the compression spring and lift spring provide a combined calibrated force to clamp the land grid array integrated circuit device to the socket thereby causing complete electrical contact therebetween.

17. The universal clamping system as recited in claim 16, wherein the compression assembly further includes:

a support arm including a bracket having extending arms, wherein the bracket includes a plurality of apertures; and a mechanical frame juxtaposed to the underside of the support arm and including an aperture aligned in relation to each aperture of the bracket of the support arm to form four sets of contiguous apertures, wherein one of the plurality of screws is inserted into each of the contiguous apertures, and for each screw the lift spring is positioned between the upwardly facing side of the support arm and the top of the screw and the compression spring is positioned between the mechanical frame and the base of the heat sink.

18. The universal clamping system as recited in claim 16, wherein the at least one lift spring has a nominal deflection of 0.40 inches.

19. The universal clamping system as recited in claim 16, wherein the at least one compression spring has a nominal deflection of 0.211 inches.

20. A universal clamping system that permits the clamping of a land grid array integrated circuit device within a socket mounted to a circuit board that results in complete electric contact therebetween, the universal clamping system comprising:

a support structure;

a cam arm assembly mounted on the support structure for providing movement and force toward the socket to seat the land grid array integrated circuit device within the socket;

a plurality of exchangeable calibrated springs coupled to the cam arm assembly to provide an adequate level and direction of clamping force to clamp the land grid array integrated circuit device within the socket; and at least one actuation arm connected to the cam arm assembly and movable to clamp the land grid array integrated circuit device in a downward vertical direction within the socket, wherein pads of the land grid array integrated circuit device are positioned into complete electrical contact with contacts of the socket.

21. A universal clamping system that permits the clamping of a land grid array integrated circuit device within a socket mounted to a circuit board that results in complete electric contact therebetween, the universal clamping system comprising:

a support structure;

a cam arm assembly mounted on the support structure for providing movement and force toward the socket to seat the land grid array integrated circuit device within the socket;

an exchangeable shim mounted on the circuit board to enable the universal clamping system to adjust to a particular height of the socket; and at least one actuation arm connected to the cam arm assembly and movable to clamp the land grid array integrated circuit device in a downward vertical direction within the socket, wherein pads of the land grid array integrated circuit device are positioned into complete electrical contact with contacts of the socket.

* * * * *